United States Patent
Zhu et al.

(10) Patent No.: US 9,176,183 B2
(45) Date of Patent: Nov. 3, 2015

(54) METHOD AND SYSTEM FOR WAFER QUALITY PREDICTIVE MODELING BASED ON MULTI-SOURCE INFORMATION WITH HETEROGENEOUS RELATEDNESS

(71) Applicant: International Business Machines Corporation, Armonk, NY (US)

(72) Inventors: Yada Zhu, White Plains, NY (US); Jingrui He, Yorktown Heights, NY (US); Robert Jeffrey Baseman, Brewster, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 414 days.

(21) Appl. No.: 13/651,974

(22) Filed: Oct. 15, 2012

(65) Prior Publication Data

US 2014/0107828 A1    Apr. 17, 2014

(51) Int. Cl.
*G06F 19/00* (2011.01)
*G05B 13/02* (2006.01)
*G06F 17/00* (2006.01)
*G06F 11/00* (2006.01)
*H01L 21/00* (2006.01)
(Continued)

(52) U.S. Cl.
CPC ............ *G01R 31/2831* (2013.01); *H01L 22/14* (2013.01); *H01L 22/20* (2013.01); *H01L 2924/0002* (2013.01)

(58) Field of Classification Search
CPC ......... G06F 17/50; G06F 17/10; G06F 19/00; G06N 99/00; G06N 5/04; G05B 13/02
USPC ......... 700/121, 28–33, 37, 40, 41, 44–46, 48, 700/75, 96, 104, 108–110; 703/2, 14; 706/55; 714/26; 716/136; 438/5–14
See application file for complete search history.

(56) References Cited

U.S. PATENT DOCUMENTS 6,249,712 B1    6/2001  Boiquaye
6,868,353 B1 *  3/2005  Ryskoski ........................ 702/84
(Continued)

OTHER PUBLICATIONS

"Application of Generalized Linear Models to Predict Semiconductor Yield Using Defect Metrology Data" Krueger, D.C.; Montgomery, D.C.; Mastrangelo, C.M. Semiconductor Manufacturing, IEEE Transactions onvol. 24, Issue: 1, Publication Year: 2011, pp. 44-58 Digital Object Identifier: 10.1109/TSM.2010.2089377.
(Continued)

*Primary Examiner* — Mohammad Ali
*Assistant Examiner* — Md Azad
(74) *Attorney, Agent, or Firm* — Whitham Curtis Christofferson & Cook, PC

(57) ABSTRACT

The present invention generally relates to the monitoring and controlling of a semiconductor manufacturing environment and, more particularly, to methods and systems for virtual meteorology (VM) applications based on data from multiple tools having heterogeneous relatedness. The methods and systems leverage the natural relationship of the multiple tools and take advantage of the relationship embedded in process variables to improve the prediction performance of the VM predictive wafer quality modeling. The prediction results of the methods and systems can be used as a substitute for or in conjunction with actual metrology samples in order to monitor and control a semiconductor manufacturing environment, and thus reduce delays and costs associated with obtaining actual physical measurements.

13 Claims, 7 Drawing Sheets

(51) Int. Cl.
*G06F 7/60* (2006.01)
*G06F 17/50* (2006.01)
*G06F 11/16* (2006.01)
*G06F 11/22* (2006.01)
*G01R 31/28* (2006.01)
*H01L 21/66* (2006.01)

(56) References Cited

U.S. PATENT DOCUMENTS

| | | | |
|---|---|---|---|
| 7,343,217 B2 | 3/2008 | Tanaka et al. | |
| 7,533,313 B1 | 5/2009 | Retersdorf et al. | |
| 7,546,170 B2 | 6/2009 | Ayala et al. | |
| 7,778,715 B2 | 8/2010 | Kirshenbaum et al. | |
| 7,996,102 B2 | 8/2011 | Hendler et al. | |
| 2005/0288812 A1* | 12/2005 | Cheng et al. | 700/109 |
| 2006/0129257 A1 | 6/2006 | Chen et al. | |
| 2007/0100487 A1* | 5/2007 | Cheng et al. | 700/108 |
| 2007/0225853 A1* | 9/2007 | Matsushita et al. | 700/121 |
| 2009/0276075 A1 | 11/2009 | Good et al. | |
| 2010/0312374 A1 | 12/2010 | Tsai et al. | |
| 2011/0202160 A1 | 8/2011 | Moyne | |
| 2011/0320026 A1 | 12/2011 | Chen et al. | |
| 2013/0339919 A1 | 12/2013 | Baseman et al. | |

OTHER PUBLICATIONS

"A Virtual Metrology System for Predicting End-of-Line Electrical Properties Using a MANCOVA Model With Tools Clustering" Tian-Hong Pan; Bi-Qi Sheng; Wong, D.S.-H.; Shi-Shang Jang Industrial Informatics, IEEE Transactions on vol. 7, Issue: 2, Publication Year: 2011, pp. 187-195 Digital Object Identifier: 10.1109/TII.2010.2098416.

"A Convex Formulation for Learning Shared Structures from Multiple Tasks" Jianhui Chen; Lei Tang; Jun Liu; Jieping Ye Proceedings of the 26th International Conference on Machine Learning, Montreal, Canada, p. 18, 2009.

"Convex Multi-Task Feature Learning" Andreas Argyriou; Theodoros Evgeniou; Massimiliano Pontil Machine Learning, vol. 73, Issue: 2, Publication Year: 2008, pp. 243-272.

* cited by examiner

METHOD AND SYSTEM FOR WAFER QUALITY PREDICTIVE MODELING BASED ON MULTI-SOURCE INFORMATION WITH HETEROGENEOUS RELATEDNESS

BACKGROUND OF THE INVENTION

The present invention is motivated by the application of virtual metrology (VM) in semiconductor manufacturing where the goal is to predict wafer quality for purposes of controlling and monitoring the processing of wafers.

Since the manufacturing process is very complex, after each step, semi-finished wafers in selected lots are sampled for actual metrology to monitor the process performance. Based on the actual metrology sampling results, the process control system will take appropriate action to adjust the process variables by lot or by wafer. In addition, if the actual metrology sampling results are inconsistent with given quality standards, the defective wafers are not sent to the following recipe processes in order to reduce production cost.

Modern semiconductor processing tools publish large amounts of real-time data which can reflect the actual processing conditions, such as temperature, pressure, gas flow, and throttle valve positions, to name a few. The large amounts of data present an opportunity to predict or classify wafer quality (process output) based on process variables. The model-based prediction of a process outcome, which is used instead of actual physical measurements of that outcome, or in addition to the actual measurements, is referred to as VM in the semiconductor industry. In contrast to lot-by-lot process control, the predicted process output in the absence of actual metrology provides additional and real-time information for run-to-run process control at the wafer level (i.e., wafer-by-wafer).

U.S. Pat. No. 7,778,715 discloses a method for obtaining a state description associated with a system having a component and automatically obtaining a substantially optimal parameterization for the component based on one or more operant characteristics of the component predicted by a behavior prediction model using combinations of the system's state description and a set of possible parameterizations for the component. U.S. Patent Application Publication No. 2011/0202160 discloses methods, apparatuses, and systems for determining adaptive predictive algorithms for VM. The computer implemented method taught by the prior art identifies a plurality of predictive algorithms and determines when to use one or more of the plurality of predictive algorithms to predict one or more VM variables in a manufacturing facility.

In the prior art, as disclosed in U.S. Pat. No. 7,546,170, the trend of a predictive term is estimated based on past values and used as a controller. U.S. Pat. No. 6,249,712 discloses a system for adaptively controlling a wide variety of complex processes, despite changes in process parameters and despite both sudden and systematic drifts in the process. The prior art system estimates the dynamic component of a drifting process or system and thereby identifies the trend of output response variables of the controlled process. Using this information, the system taught in the prior art predicts future outputs based on a history of past and present inputs and outputs, thereby recommending the necessary control action or recipe to cancel out the drifting trend.

U.S. Patent Application Publication No. 2009/0276075 discloses, in a complex manufacturing environment for producing semiconductor devices, a predicted quality distribution in the form of a graded die forecast may be monitored with respect to changes in order to more efficiently identify factory disturbances. The prior art teaches the selection of process variables to build a top-level mathematical model for subsequent processes as disclosed by U.S. Pat. No. 7,996,102. U.S. Pat. No. 7,533,313 discloses a method for converting data that includes generating a first data vector of data measurements related to processing of at least one workpiece.

The prior art disclosed in U.S. Patent Application Publication No. 2011/0320026 presents methods for processing the raw wafer manufacturing data to select the best data therefrom in accordance with at least one of a plurality of knowledge-, statistic-, and effect-based processes and tracking features for generating prediction and control data therefrom. U.S. Patent Application Publication No. 2006/0129257, U.S. Pat. No. 7,343,217, and U.S. Patent Application Publication No. 2010/0312374 disclose a semiconductor manufacturing information framework including VM to operate a processing tool for semiconductor manufacturing.

The performance of prior art VM applications can be dramatically impacted by the lack of training examples, which is the direct result of hundreds of process variables with intricate dependencies, hidden patterns, tool wear, and process dynamics.

In addition, a given process in semiconductor manufacturing is usually running on multiple fabrication tools and each of which has multiple chambers with multiple sides that possess different capabilities or are controlled independently. For VM applications, each chamber-side of each of the fabrication tools can be modeled to predict the quality of wafers produced therein. In current practice due to issues of cost and the frequency of actual metrology sampling, the building of one unique model at a time that predicts the quality of products produced in a single side of a single tool requires a great deal of time and expense in order to collect sufficient training examples. Due to tool wear, process dynamics and other reasons, unseen data patterns occur often and the performance of the prediction model can degrade quickly. Under current practices, it is difficult to maintain and update each of the unique models that predict wafer quality in a single side of a single fabrication tool for the hundreds of processes that each of the wafers must go through during manufacturing. Accordingly, there is a need to address the problems in the prior art.

SUMMARY OF THE INVENTION

Exemplary embodiments of the present invention are methods and systems for wafer quality predictive modeling in semiconductor manufacturing VM applications that utilize the natural relationship of the production equipment in order to leverage the relatedness of the chamber-sides of the semiconductor fabrication tools, while maintaining adequate quality run-to-run process control at the wafer level.

Additional exemplary embodiments of the invention are methods and systems for wafer quality predictive modeling in semiconductor manufacturing VM applications that take advantage of the relationship embedded in the large amounts of real-time data that reflect the actual processing conditions to compensate for the lack of training examples required to generate satisfactorily accurate predictions models for a single chamber-side and improve the prediction performance of the VM.

Further exemplary embodiments of the invention are methods and systems for wafer quality predictive modeling in semiconductor manufacturing VM applications that minimize the frequency of actual metrology sampling in order to reduce the associated actual metrology costs.

In a preferred embodiment of the invention, a method for predicting quality of wafers produced by production equipment having heterogeneous relatedness including receiving process variables, of each of the wafers, which are indicative of the production of each of the wafers processed by the production equipment, and historical measurements, which are examples of actual wafer quality measurements, grouping the wafers according to the heterogeneous relatedness of the production equipment, partitioning the process variables into two sets, generating a prediction model that accommodates the grouping of the wafers and is based on the partitioned process variables and the historical measurements, predicting a quality of each of the wafers based on the prediction model generated, and optimizing the prediction model by implementing a block coordinate descent with an accelerated update, in which the steps are executed by a virtual metrology machine implemented on a computer.

In another embodiment of the invention, a method for predicting quality of wafers produced by production equipment having heterogeneous relatedness includes measuring the process variables of each of the wafers, sending the process variables to a central database, computing a predicted quality for each of the wafers based on the prediction model generated, sending the predicted quality of each of the wafers to an advanced process controller and the central database, measuring an actual quality of at least one sample of the wafers, sending the actual quality of at least one sample of the wafers to the advanced process controller and the virtual metrology machine, updating the virtual metrology machine with the actual quality of at least one sample of the wafers, determining a feedback control by the advanced process controller based on the predicted quality or the predicted quality and the actual quality, and processing the wafers by the production tool in accordance with the feedback control.

An additional embodiment of the invention is a system for predicting quality of wafers processed by production equipment having heterogeneous relatedness including means for receiving process variables of each of the wafers, which are indicative of the production of each of the wafers produced by the production equipment, and historical measurements, which are examples of actual wafer quality measurements, means for grouping the wafers according to the heterogeneous relatedness of the production equipment, means for partitioning the process variables into two sets, means for generating a prediction model that accommodates the grouping of the wafers and is based on the partitioned process variables and the historical measurements, means for predicting a quality of each of the wafers based on the prediction model, and means for optimizing the prediction model by implementing a block coordinate descent with an accelerated update.

A further preferred embodiment of the invention is a system for predicting quality of wafers produced by production equipment having heterogeneous relatedness includes means for measuring the process variables of each of the wafers, means for sending the process variables to a central database, means for processing the wafers by the production tool in accordance with a feedback control, and an actual metrology tool to measure an actual quality of at least one sample of the wafers, to send the actual quality of at least one sample of the wafers to an advanced process controller and a virtual metrology machine, and to update the virtual metrology machine with the actual quality of at least one sample of the wafers, in which the virtual metrology machine computes a predicted quality for each wafer and sends the predicted quality of each of the wafers to the advanced process controller and the central database, and in which the advanced process controller determines the feedback control based on the predicted quality or the predicted quality and the actual quality.

In yet another preferred embodiment, the methods and systems for predicting quality of wafers produced by production equipment having heterogeneous relatedness include that the production equipment includes a plurality of production tools, each of the plurality of production tools having multiple chambers, and each of the multiple chambers having multiple sides, in which each of the multiple sides processes one of the wafers, and the heterogeneous relatedness of the production equipment corresponds to each of the multiple chambers forming a group of the wafers processed in the multiple sides of each of the multiple chambers.

In a further embodiment, the methods and systems for predicting quality of wafers produced by production equipment having heterogeneous relatedness include that one of the two sets of the process variables represents independent variables, which are subject to the advanced process controller, and one of the two sets of the process variables represents dependent variables, which have an impact on the quality of the wafers that are heavily dependent on the independent variables.

In still an additional preferred embodiment, the methods and systems for predicting quality of wafers produced by production equipment having heterogeneous relatedness include that the prediction model is generated as a function of coefficient vectors for the independent variables and the dependent variables, and the prediction model accommodates the grouping of the wafers by connecting the coefficient vectors for the independent variables and the dependent variables through a transformation matrix and imposing similarity on the coefficient vectors for one or more of the independent variables and the dependent variables.

DETAILED DESCRIPTION OF THE INVENTION

The present invention relates to methods and systems for the modeling and predicting of the quality of wafers produced by production equipment having multiple tools with heterogeneous relatedness for VM applications that monitor and control a semiconductor manufacturing setting wafer-by-wafer. In particular, the present invention addresses a novel setting in VM model-based predictions where each side of each chamber of each tool represents a single modeling task that predicts the quality of wafers produced therein based on historical data, and each chamber can be seen as a group of such tasks, and hence the sides/tasks may be grouped according to a heterogeneous relatedness of the production equipment that can be leveraged by the VM predictive modeling. Moreover, the tasks form multiple groups, and the relatedness between two tasks depends on whether they come from the same group or not (i.e., belong to same chamber or not). It is understood, however, that specific embodiments are provided as examples to teach the broader inventive concept, and one of ordinary skill in the art can easily apply the teachings of the present disclosure to other methods and systems. Also, it is understood that the methods and systems discussed in the present disclosure include some conventional structures and/or steps. Since these structures and steps are well known in the art, they will only be discussed in a general level of detail. Furthermore, reference numbers are repeated throughout the drawings for the sake of convenience and example, and such repetition does not indicate any required combination of features or steps throughout the drawings.

Figure 1A:
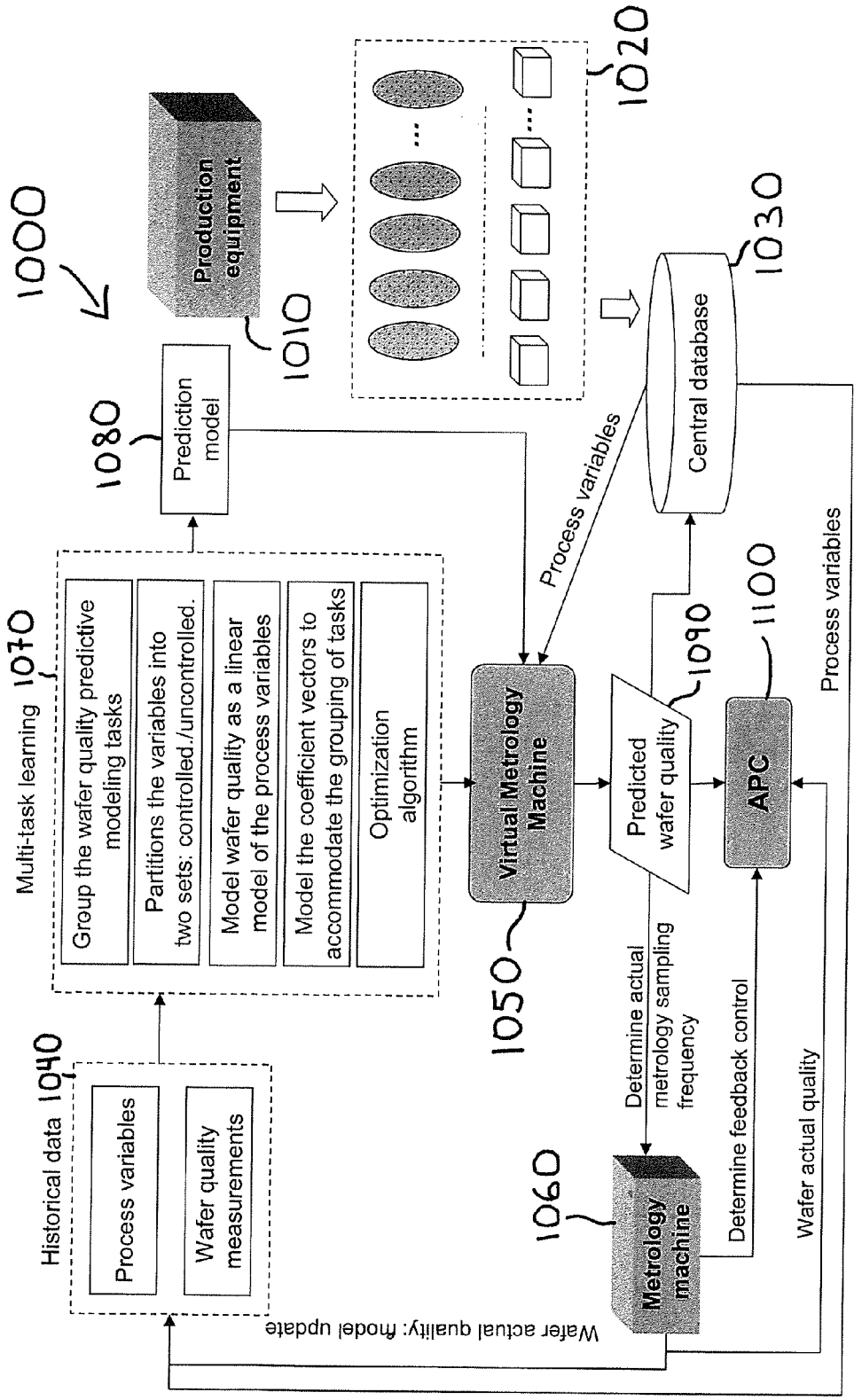
FIG. 1(a) is a high-level diagram of the exemplary architecture illustrated in FIG. 1(b), in which methods and systems of the present invention may be implemented.
Figure 1B:
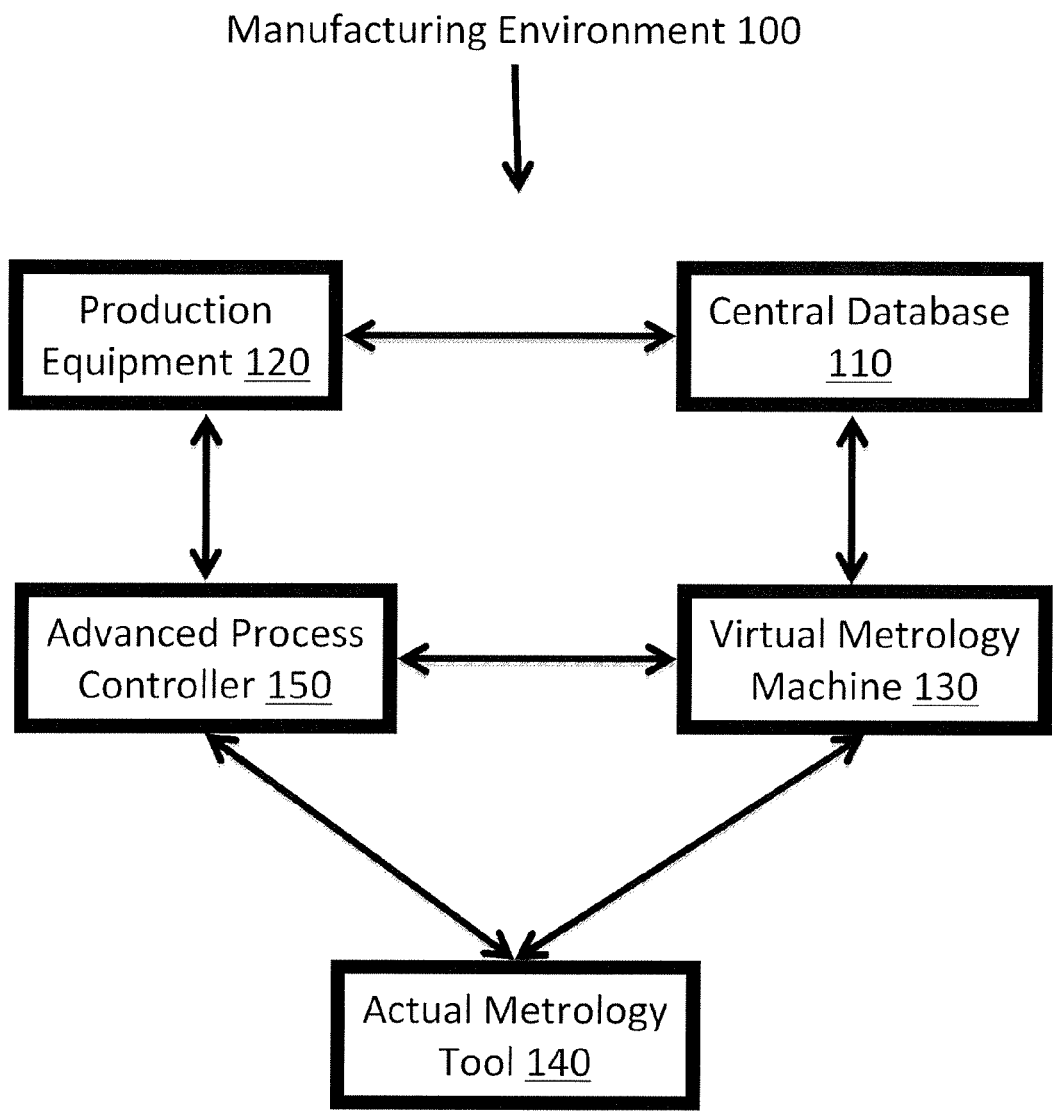
FIG. 1(b) is an illustrative exemplary architecture of a manufacturing environment 100 in which embodiments of the present invention may operate.

FIG. 1(a) is a high-level diagram of the exemplary architecture illustrated in FIG. 1(b), in which methods and systems of the present invention may be implemented. The semiconductor manufacturing setting 1000 includes production equipment 1010 for the processing and the production of wafers. The production equipment 1010 may consist of multiple tools that have a natural relationship because, as illustrated in detailed view 1020, each tool consists of multiple chambers, and each chamber consists of number of sides. Consequently, as further shown in 1020, each side of the multiple tools processes one wafer, and each chamber forms a group of the wafers processed in the sides of its chamber.

In addition, the production equipment 1010 provides process variables corresponding to each of the sides of the multiple chambers to the central database 1030 for storage. Because of the natural relationship between the multiple tools of the production equipment 1010, the wafers share some process variables with wafers processed in their group/chamber. Thus, the heterogeneous relatedness of the production equipment 1010 can be leveraged by the virtual metrology machine 1050 to provide predictive wafer quality modeling for each side of each tool. In one embodiment, the central database 1030 sends the process variables from each of the sides of the plurality of chambers to the virtual metrology machine 1050 in order to utilize the natural correlation of the production equipment 1010 and the relationship embedded in the process variables to predict wafer quality. In addition, the virtual metrology machine 1050 may receive historical data 1040 that includes wafer quality measurements provided by the metrology machine 1060 based on its sampling frequency and the corresponding process variables received from the central database 1030, which may serve as an update to the predictive wafer quality modeling.

At the multi-task learning block 1070, the virtual metrology machine 1050 generates an individual prediction model 1080 for each of the sides that processes one of the wafers in the production equipment 1010, such that each side can be seen as a single modeling task that predicts the quality of wafers produced therein based on the historical data 1040, and each chamber can be seen as a group of such tasks. For example at block 1070, the virtual metrology machine 1050 groups the wafer quality predictive modeling tasks, partitions the process variables into two sets (e.g., controlled and uncontrolled), models wafer quality as a linear model of the process variables, models the coefficients vectors of the linear model to accommodate the grouping of wafer quality predictive modeling tasks, and implements an optimization algorithm to generate the prediction model 1080.

The virtual metrology machine 1050 may utilize the prediction model 1080 in order to compute a predicted wafer quality 1090. The predicted wafer quality 1090 may be stored in central database and sent to the advanced process controller (APC) 1100 in the absence of or in addition to the wafer actual quality provided by the metrology machine 1060 to determine a feedback control for the production equipment 1010. In an effort to reduce the number of physical measurements needed to maintain satisfactory wafer quality process control, an actual metrology sampling frequency may be determined based on the predicted wafer quality 1090 and wafer actual quality as measured by the metrology machine 1060.

FIG. 1(b) is an illustrative exemplary architecture of a manufacturing environment 100 (e.g., factory), in which embodiments of the present invention may operate. The manufacturing environment 100 may be a semiconductor manufacturing environment. In one embodiment, the manufacturing environment 100 includes a central database 110, production equipment 120, a virtual metrology machine 130, an actual metrology tool 140, and an advanced process controller 150. The central database 110, the production equipment 120, the virtual metrology machine 130, the actual metrology tool 140, and the advanced process controller 150 may be interconnected via a network (see FIG. 4), such as a public network (e.g., Internet), a private network (e.g., Ethernet or a local area network (LAN)), or a combination thereof. The central database 110, the production equipment 120, the virtual metrology machine 130, the actual metrology tool 140, and the advanced process controller 150 may be or include any or all the components of computer system 400 as discussed in detail below with respect to FIG. 4.

The production equipment 120 has heterogeneous relatedness. In one embodiment specific to a semiconductor manufacturing environment, the production equipment 120 may consist of multiple tools to produce wafers. The wafers may be produced based on the same recipe. Typical to semiconductor manufacturing, the multiple tools may include multiple chambers having multiple sides. Accordingly, one of the wafers is produced in one of the multiple sides of one of the multiple chambers of the production equipment 120. The production equipment 120 can measure the process variables of each the wafers, which indicate the processing of each the wafers produced by the production equipment 120. The process variables may be sent to the central database 110. For example, the process variables may include, but are not limited to, temperature, pressures, gas flow per unit time, etc.

The central database 110 may include databases, file systems, or other arrangement of data on nonvolatile memory (e.g., hard disk drives, tape drives, optical drives, etc.), volatile memory (e.g., random access memory (RAM)), or combination thereof, which is discussed in detail below in regards to FIG. 4. In one embodiment, the central database 110 may receive and store data generated by and sent from the production equipment 120, the virtual metrology machine 130, the actual metrology tool 140, and/or the advanced process controller 150. The central database 110 may also receive actual wafer quality measurements sent from the actual metrology tool 140. The actual wafer quality measurements may be stored by the central database 110 as histories of the actual physical outcomes of the wafers processed by production equipment 120. In one embodiment, the central database 110 sends the measured process variables and the historical actual wafer quality measurements to the virtual metrology machine 130 to generate a prediction model of the quality of wafers produced by the production equipment 120.

The virtual metrology machine 130 may receive the process variables and the historical measurements from the central database 110 and predict the quality of wafers produced by the production equipment 120 based on the process variables and the historical measurements. Such capability is explained in greater detail below with reference to FIG. 3. In one embodiment, the virtual metrology machine 130 is connected to the advanced process controller 150 and sends the predicted wafer quality to the advanced process controller 150 to facilitate and improve control of the production equipment 120. The predicted wafer quality may also be sent by the virtual metrology machine 130 to the central database 110 for storage.

The actual metrology tool 140 can measure the actual quality of the wafers produced by the production equipment 120. In one embodiment, the actual metrology tool 140 selects wafers by lots to sample their actual metrology and to determine an actual metrology sampling frequency in order to monitor the process performance. The number of samples of physical measurements required to be made by the actual metrology tool 140 may be reduced given the improved prediction performance of virtual metrology machine 130. Accordingly, the costs and delay associated with actual metrology may be minimized, while maintaining or even improving wafer quality control in the manufacturing environment 100. In a preferred embodiment, the actual metrology tool 140 updates the virtual metrology machine 130 by sending the actual wafer quality. The actual wafer quality may also be sent to the advanced process controller 150 to facilitate and improve control of the production equipment 120 and to the central database 110 for storage as historical measurements. The stored historical measurements may serve as examples to assist in the generation of the prediction model by virtual metrology machine 130.

The advanced process controller 150 may manage some or all operations of the manufacturing environment 100. In one embodiment, the advanced process controller 150 monitors and controls the production equipment 120. The advanced process controller 150 can receive the predicted wafer quality from the virtual metrology machine 130 and the actual wafer quality from the actual metrology tool 140. The advanced process controller 150 determines a feedback control based on the predicted wafer quality, the actual wafer quality, or a combination thereof. The feedback control is used to control the production of the wafers produced by the production equipment 120. The production equipment 120 may produce wafers in accordance with the feedback control determined by the advanced process controller 150.

Figure 2:
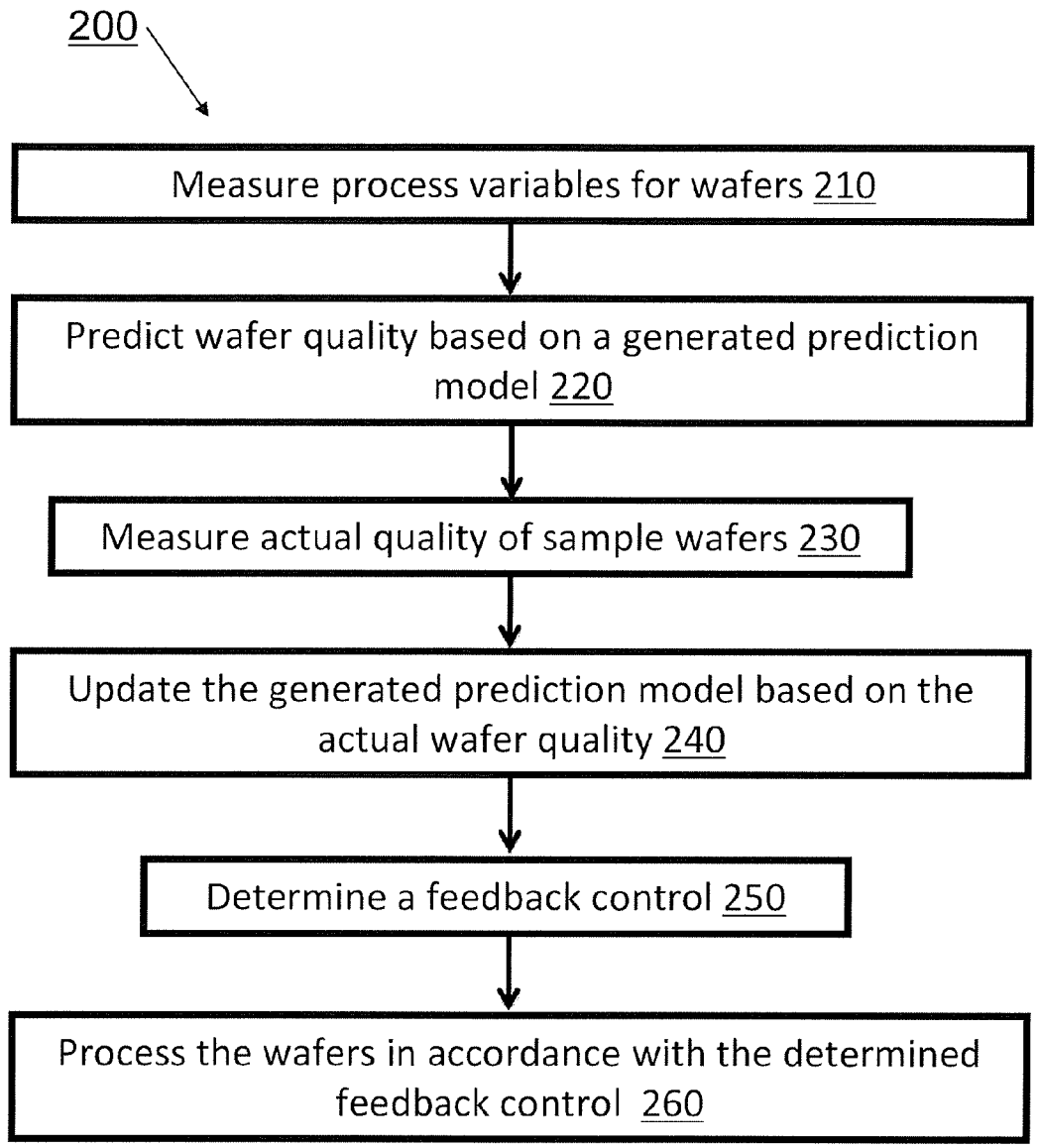
FIG. 2 illustrates a flow diagram of one embodiment for the method 200 to predict quality of wafers and to process wafers in accordance with the prediction.

FIG. 2 illustrates a flow diagram of one embodiment for a method 200 to predict quality of wafers and to process wafers in accordance with the prediction. Some or all the steps of the method 200 may be performed by processing logic that may comprise hardware (e.g., circuitry, dedicated logic, programmable logic, microcode, etc.), software (such as instructions run on a processing device), or a combination thereof. In a preferred embodiment, the method 200 may be performed by the central database 110, the production equipment 120, the virtual metrology machine 130, the actual metrology tool 140, and the advanced process controller 150.

The method 200 includes measuring the process variables of each of the wafers produced by the production equipment 120 (block 210). In one embodiment, the production equipment 120 sends the measured process variables to the central database 110. The central database 110 may receive and store the process variables measured by the production equipment 120 and the central database 110 may send the process variables to the virtual metrology machine 130.

The method 200 includes predicting the quality of the wafers based on the prediction model that was generated by the virtual metrology machine 130 (block 220). Such capability is further detailed below in reference to FIG. 3. In a particular embodiment, the virtual metrology machine 130 sends the predicted quality of each of the wafers to the advanced process controller 150 for purposes of controlling and monitoring the production equipment 120. The virtual metrology machine 130 may also send the predicted quality of each wafer to the central database 110 for purposes of storage. Accordingly, the method 200 reduces the number of examples required to accurately predict wafer quality, utilizes the natural relationship of multiple fabrication tools, and takes advantage of the relationship embedded in the process variables.

At block 230, the method 200 includes the actual metrology tool 140 measures the actual quality of a sample of the wafers produced by the production equipment 120. The actual metrology tool 140 may sample wafers by lots to measure their actual metrology and to determine an actual metrology sampling frequency. Further, in consideration of the costs and time associated with measuring the quality of the wafers during a semiconductor manufacturing process, it would be advantageous to reduce the number of samples needed to be taken at block 230, but without sacrificing process performance. In one embodiment, the actual metrology tool 140 sends the actual quality of the sampled wafers to the advanced process controller 150 for purposes of controlling and monitoring the production equipment 120.

The method 200 includes updating the prediction model generated by the virtual metrology machine 130 (block 240). In a particular embodiment, the actual metrology tool 140 sends the actual quality of the wafers measured by the actual metrology tool 140 to the virtual metrology machine 130 for purposes of updating the prediction model. Further, the actual metrology tool 140 sends the measured actual wafer qualities to the central database 110 for storage as historical measurements.

The method 200 includes the advanced process controller 150 determining a feedback control based on the predicted wafer quality and/or the actual wafer quality (block 250). The predicted wafer quality may be received by the advanced process controller 150 from the virtual metrology machine 130, and the actual wafer quality may be received by the advanced process controller 150 from the actual metrology tool 140. Compared to traditional lot-to-lot control, the feedback control based on virtual and actual metrology values may be used to manage the production equipment 120 on a wafer-by-wafer basis in order to enhance final yield, predict equipment maintenance, and improve productivity. At block 260, the production equipment 120 processes and produces wafers in accordance with the feedback control determined by the advanced process controller 150.

Figure 3:
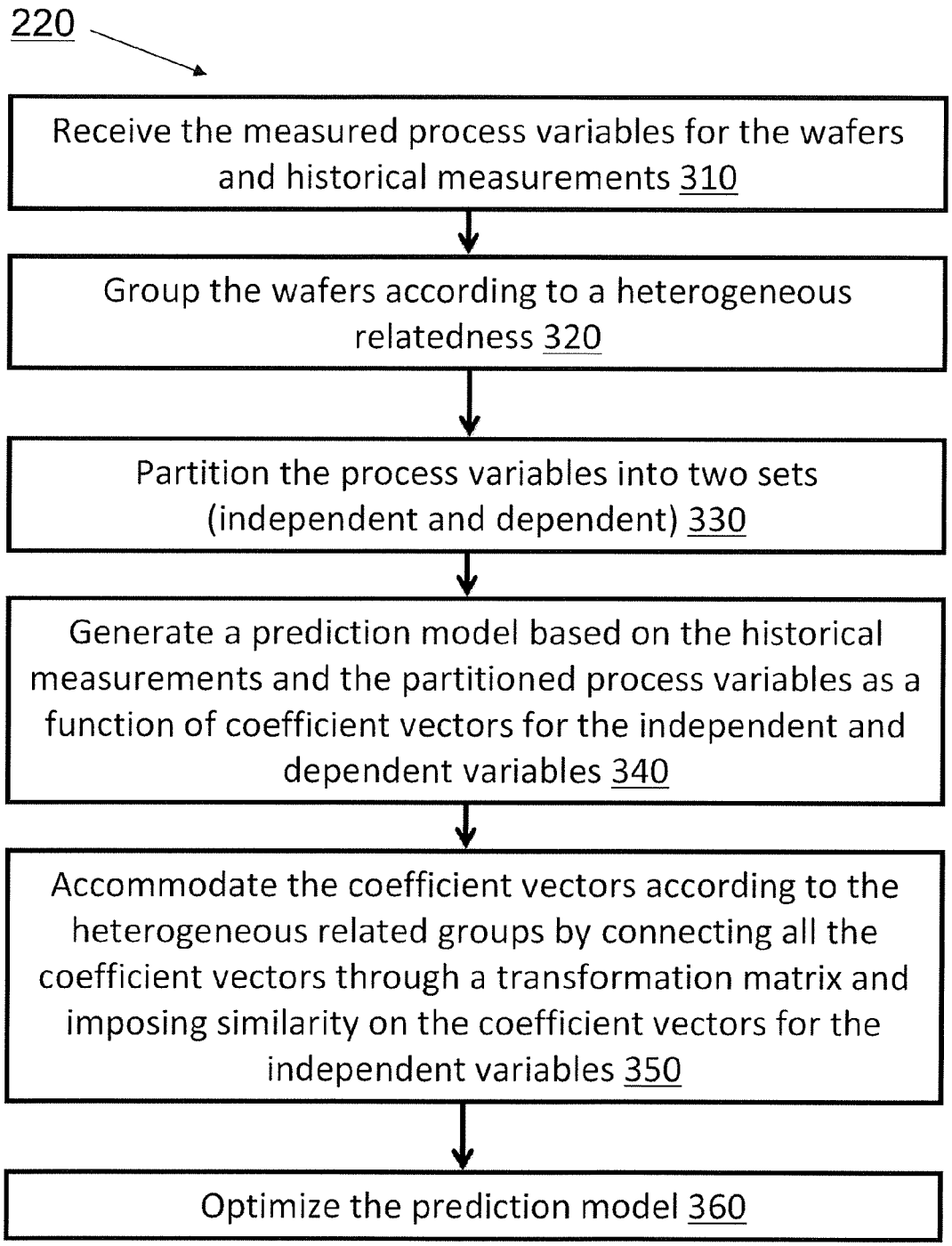
FIG. 3 illustrates a flow diagram of one embodiment for block 220 of the method 200 to predict quality of wafers based on a generated model.

FIG. 3 illustrates a flow diagram of one embodiment for block 220 of the method 200 to predict quality of wafers based on a generated model. Block 220 of the method 200 may be performed by processing logic that may comprise hardware (e.g., circuitry, dedicated logic, programmable logic, microcode, etc.), software (such as instructions run on a processing device), or a combination thereof. Such capabilities are described in greater detail below with respect to FIG. 4. In a preferred embodiment, the virtual metrology machine 130 performs block 220 of the method 200.

Referring to FIG. 3, at block 310, the historical measurements and the measured process variables for the wafers are received for purposes of generating a prediction model of wafer quality. In one embodiment, the virtual metrology machine 130 receives the process variables measured for each of the wafers produced by the production equipment 120 and corresponding historical measurements of actual wafer quality. As an example, the process variables may include, but are not limited to, temperature, pressure and gas flow per unit time, and can be used to predict the quality of the wafers produced by the production equipment 120.

At block 320, the wafers are grouped according to a known heterogeneous relatedness. In one embodiment, the virtual metrology machine 130 can group the wafers according to the heterogeneous relatedness of the production equipment 120. As detailed above, typically wafers are produced in multiple sides of multiple chambers of the production equipment 120 in semiconductor manufacturing. Each side can be seen as a single task with a model that predicts the quality of wafers produced therein based on the process variables, and each chamber can be seen as a group of such tasks. Consequently, wafers from the same side of the same chamber follow the same model, wafers from different sides of the same chamber follow similar models, wafers from different chambers may have different models, and hence the heterogeneous relatedness between the wafers produced by the production equipment 120. In one embodiment, the production equipment 120 is assumed to have C number of chambers (i.e., groups of tasks), and the $t^{th}$ chamber (i.e., the $t^{th}$ group) has $S_t$ number of sides/tasks.

At block 330, the process variables are partitioned into two sets, one set represent the independent variables and the other set represents the dependent variables. In a preferred embodiment, the virtual metrology machine 130 partitions the process variables into two sets. The process variables measured for each wafer/example may be partitioned into two sets: independent and dependent. The set of independent variables, expressed as $d_1$, may include, but are not limited to, pressures, power, temperature, gas flows, etc., which may be subject to the advanced process controller 150. And, the set of dependent variables, expressed as $d_2$, may include, but are not limited to, impedance, electric bias, throttle valve positions, etc., and their impact on the wafer quality may be heavily dependent on the independent variables. The process variables may be partitioned based on their own characteristics and/or their correlation to wafer quality.

At block 340, a prediction model is generated that takes advantage of the relationship embedded in the process variables. In one embodiment, the virtual metrology machine 130 generates a prediction model based on the partitioned process variables and the received historical measurements. As an example, for the $s^{th}$ side of the $t^{th}$ chamber (t=1, ..., T, s=1, ..., $S_t$) of the production equipment 120, let $n_{t,s}$ denote the number of wafers/examples produced therein, $A_{t,s} \in R^{n_{t,s} \times d_1}$ denote the independent variables for all the wafers/examples, $B_{t,s} \in R^{n_{t,s} \times d_2}$ denote the dependent variables for all the wafers/examples, and $y_{t,s} \in R^{n_{t,s}}$ denote the quality of the wafers in terms of deposition thickness. The prediction model is not limited to determining wafer quality in Willis of deposition thickness, but it may, for example, also predict wafer quality in terms of resistance, stress, refractive index, etc. For example, to predict wafer quality, a linear model is generated, which is commonly used in VM applications, which may be expressed as:

$$\hat{y}_{t,s} = A_{t,s}\alpha_{t,s} + B_{t,s}\beta_{t,s}$$

where $\hat{y}_{t,s}$ is the predicted wafer quality of the $s^{th}$ side of the $t^{th}$ chamber, $\alpha_{t,s} \in R^{d_1}$ is the coefficient vector for the independent variables, and $\beta_{t,s} \in R^{d_2}$ is the coefficient vector for the dependent variables. For example, the predicted wafer quality can advantageously prompt process control timely, detect fault wafers early, and improve productivity by reducing actual metrology frequency.

In a preferred embodiment, the correlation of wafer quality with the set of independent variables is often considered to be the same for different sides of the same chamber. This is because the independent variables correspond to the controlled parameters in the production process to achieve a specific set point, and their values are set such that the quality of the produced wafers meet certain standards. For different sides of the same chamber with a fixed environment, the controlled parameters affect the wafer quality in the same way. On the other hand, the correlation of wafer quality with the set of dependent variables is affected by the independent variables. This is because the dependent variables correspond to the uncontrolled parameters. Their impact on the wafer quality is closely related to the environment of the chamber, which is determined by the controlled parameters.

At block 350, the generated model accounts for the groups formed in accordance with the known heterogeneous relatedness. In a preferred embodiment, the virtual metrology machine 130 accommodates the coefficient vectors of the generated model in block 340 according to the grouping by heterogeneous relatedness in block 320. The generated model may accommodate the grouping by connecting all the coefficient vectors through a transformation matrix and/or imposing similarity on the coefficient vectors for the independent variables and/or the dependent variables. Accordingly, the virtual metrology machine 130 may leverage the heterogeneous relatedness of the production equipment 120 to improve prediction performance.

In a preferred embodiment, for different sides of the same chamber, the corresponding tasks/sides are related via the same coefficient vector for the set of independent variables, and the relatedness between the coefficient vectors for independent variables and dependent variables. Therefore, to generate a prediction model that accommodates the grouping of the wafers, $\alpha_{t,s}$ is replaced with $\alpha_t$ since it only varies with chambers/groups of tasks. On the other hand, for different chambers/groups of tasks, their coefficient vectors for the set of independent variables should be similar. Therefore, the tasks associated with all the sides of all the chambers exhibit heterogeneous relatedness.

As an example, a prediction model based on the historical measurements and the two sets of process variables that accommodates the grouping of the wafers can be expressed as:

$$\Omega(\alpha_t, \beta_{t,s}, M) = \sum_{t=1}^{T} \left\{ \sum_{s=1}^{S_t} [\varsigma(y_{t,s}, A_{t,s}\alpha_t, B_{t,s}\beta_{t,s}) + \lambda_1 \|\beta_{t,s} - M\alpha_t\|^p] + \lambda_2 R(\alpha_1, \ldots, \alpha_T) \right\} \quad (1)$$

where $\varsigma(\ )$ denotes the loss function that takes as input the wafer quality in teens of the deposition thickness and the independent and the dependent variables, $R(\ )$ is the function of all the coefficient vectors for the independent variables, $M \in R^{d_2 \times d_1}$ is the transformation matrix that connects the coefficient vectors for the independent variables and the dependent variables, and p, $\lambda_1$ and $\lambda_2$ are positive parameters. Further, as discussed, the wafer quality may be expressed in various terms and is not limited to deposition thickness.

Accordingly, the first term of the exemplary prediction model that is based on the historical measurements and the partitioned process variables, and accommodates for the heterogeneous relatedness grouping, expressed as $\Omega(\ )$, measures the prediction error, the second term of $\Omega(\ )$ measures the approximation error of the coefficient vector for the dependent variables using the transformed coefficient vector for the independent variables, and the last term of $\Omega(\ )$ imposes similarity on all the coefficient vectors for the independent variables. In addition, the last term of $\Omega(\ )$ may be expressed to impose similarity on all the coefficient vectors for the dependent variables, which may be utilized as a substitute to or in addition to imposing similarity on all the coefficient vectors for the independent variables.

When generating a model to predict wafer quality as expressed in equation (1) above, various tasks (i.e., sides of chambers) may be coupled in two different ways, depending on whether the various tasks are in the same group or not (i.e., sharing the same group index t). For example, if two tasks/sides come from the same group/chamber, expressed as t, the two tasks/sides share the same coefficient vector for the independent variables, expressed as $\alpha_t$, and their coefficient vectors for the dependent variables are both close to $M\alpha_t$. As another example, if two tasks/sides come from different groups/chambers, the two tasks/sides are related only by the coefficient vectors for the independent variables. By minimizing the model to predict wafer quality, as expressed in equation (1), the method 200 leverages the heterogeneous task relatedness to construct models for all the tasks/sides of the chambers. Further, by generating a model that is a sufficiently accurate predictor of the actual wafer quality, the number of physical measurements required to be taken by actual metrology tool 140 (at block 230) will be reduced without compromising the quality control of the semiconductor manufacturing process. This benefit is especially attractive for highly complex and capital intensive semiconductor manufacturing lines, where the monitoring processes to obtain physical measurements may add significant processing time and cost.

At block 360, the virtual metrology machine 130 can optimize the prediction model generated in block 340. The optimization of the generated prediction model may be accomplished by implementing a block coordinate descent to solve equation (1). For example, in equation (1), let $\zeta(y_{t,s}, A_{t,s}\alpha_{t,s}, B_{t,s}\beta_{t,s}) = (y_{t,s} - A_{t,s}\alpha_{t,s} - B_{t,s}\beta_{t,s})^2$, p=2, and $R(\alpha_1, \ldots, \alpha_T) = \min_{\alpha_0} \Sigma_{t=1}^T (\alpha_t - \alpha_0)^2$, which encourages all the $\alpha_t$ to be close to the common vector $\alpha_0 \in R^{\Sigma_{t,s}^{d_1}} R^{d_1}$, to form the following optimization problem:

$$\min \Omega(\alpha_t, \beta_{t,s}, M, \alpha_0) = \quad (2)$$

$$\min \sum_{t=1}^T \left\{ \sum_{s=1}^{S_t} [(y_{t,s} - A_{t,s}\alpha_t - B_{t,s}\beta_{t,s})^2 + \lambda_1 \|\beta_{t,s} - M\alpha_t\|^2] \right\} +$$

$$\lambda_2 \sum_{t=1}^T (\alpha_t - \alpha_0)^2$$

While all the parameters of equation (2) are not convex, given $\alpha_t$ and $\beta_{t,s}$ (t=1, ..., T, s=1, ..., $S_t$), $\Omega(\ )$ is convex with respect to M and $\alpha_0$. On the other hand, given M and $\alpha_0$, $\Omega(\ )$ is convex with respect $\alpha_t$ and $\beta_{t,s}$ (t=1, ..., T, s=1, ..., $S_t$). Therefore, a block coordinate descent may be utilized to find the solution to optimization problem expressed as equation (2). In finding the solution to equation (2), M and $\alpha_0$ are repeatedly updated based on the current $\alpha_t$ and $\beta_{t,s}$, and vice versa until convergence.

The block coordinate descent may be accomplished by taking the partial derivative of $\Omega(\ )$ with respect to M and $\alpha_0$, and setting it to 0, to provide the following expressions:

$$M = \sum_{t=1}^T \left(\sum_{s=1}^{S_t} \beta_{t,s}\right) \alpha_t' \left(\sum_{t=1}^T S_t \alpha_t \alpha_t'\right)^{-1} \quad (3)$$

$$\alpha_0 = \frac{1}{T} \sum_{t=1}^T \alpha_t \quad (4)$$

where $\alpha_t^i$ denotes the transpose of $\alpha_t$. As shown in equations (3) and (4), both M and $\alpha_0$ are used by different groups of tasks; therefore, their estimation leverages the information from all the tasks.

On the other hand, for $\forall$t=1, ..., T, let $\gamma_t \in R^{\Sigma_{t,s}^{d_1+S_t d_2}}$ denote $[\alpha_t', \beta_{t,1}', \ldots, \beta_{t,S_t}']'$, $\gamma_t \in R^{\Sigma_{t,s}} R^{d_1+S_t d_2}$ denote $[\alpha_0, 0, \ldots, 0]'$, $y_t \in R^{\Sigma_{t,s}}$ denote $[y_{t,1}', \ldots, y_{t,S_t}']'$, $X_t \in R^{\Sigma_{t,s}} R^{(\Sigma_{t,s})\times(d_1+S_t d_2)}$ denote:

$$\begin{vmatrix} A_{t,1} & B_{t,1} & 0 & \ldots & 0 \\ A_{t,2} & 0 & B_{t,2} & \ldots & 0 \\ \vdots & \vdots & \vdots & \ddots & \vdots \\ A_{t,S_t} & 0 & \ldots & 0 & B_{t,S_t} \end{vmatrix}$$

$I_t \in R^{\Sigma_{t,s}} R^{(d_1+S_t d_2)\times(d_1+S_1 d_2)}$ denote:

$$\begin{vmatrix} I_{d_1 \times d_1} & 0 & \ldots & 0 \\ 0 & 0 & \ldots & 0 \\ \vdots & \vdots & \ddots & \vdots \\ 0 & 0 & \ldots & 0 \end{vmatrix}$$

where $I_{d_1 \times d_1}$ denotes $d_1 \times d_1$ identity matrix, and $M_t \in R^{\Sigma_{t,s}} R^{(d_1+S_t d_2)\times(d_1+S_t d_2)}$ denote:

$$\begin{vmatrix} M'M & -M' & \ldots & -M' \\ -M & I_{d_2 \times d_2} & \ldots & 0 \\ \vdots & \vdots & \ddots & \vdots \\ -M & 0 & \ldots & I_{d_2 \times d_2} \end{vmatrix}$$

Given M and $\alpha_0$, $\Omega(\ )$ can be written as a function of $\gamma_t$ (t=1, ..., T):

$$\Omega(\gamma_t) = \sum_{t=1}^T \{\|y_t - X_t\gamma_t\|^2 + \lambda_1 \gamma_t' M_t \gamma_t + \lambda_2 (\gamma_t - \gamma_0)' I_t (\gamma_t - \gamma_0)\}$$

Taking the partial derivative of $\Omega(\ )$ with respect to $\gamma_t$ and setting it to 0 and utilizing the fact that $I_t\gamma_0 = \gamma_0$, provides equation (5):

$$\gamma_t = (X_t'X_t + \lambda_1 M_t + \lambda_2 I_t)^{-1}(X_t'y_t + \lambda_2 \gamma_0) \quad (5)$$

From equation (5), by fixing M and $\alpha_0$, different groups of tasks are decoupled. Therefore, the coefficient vector $\gamma_t$ for the $t^{th}$ task can be individually estimated.

However, the tasks within the same group are still coupled due to the sharing of the coefficient vector $\alpha_t$ for the independent variables as well as the connection between the coefficient vectors $\alpha_t$ and $\beta_{t,s}$ for the two sets of variables via the transformation matrix M.

Equation (5) involves computing the inverse of a $(d_1 + S_t d_2) \times (d_1 + S_t d_2)$ matrix, which might be very time consuming, especially when the number of tasks within each group is large. This problem can be addressed by calculating an accelerated update for the block coordinate descent framework. For example, the matrix inversion expressed by equation (5) involves $X_t'X + \lambda_2 I_t$ which is fixed all the time, and $\lambda_1 M_t$ which is updated in each iteration. Furthermore, $M_t$ can be rewritten as follows:

$$M_t = M_{t1} \begin{vmatrix} I_{d_2 \times d_2} & -I_{d_2 \times d_2} \\ -I_{d_2 \times d_2} & 0 \end{vmatrix} M_{t1}' \quad (6)$$

where $M_{t1}$ is defined as follows:

$$M_{t1} = \begin{vmatrix} M' & 0 \\ 0 & I_{d_2 \times d_2} \\ \vdots & \vdots \\ 0 & I_{d_2 \times d_2} \end{vmatrix}$$

Let $C \in R^{\Sigma_{i=1}^{n} (d_1 + S_t d_2) \times (d_1 + S_t d_2)}$ denote $(X_t'X + \lambda_2 I_t)^{-1}$, and let $C_{i,j}$ denote its block in the $i^{th}$ row and $j^{th}$ column, such that $C_{1,1} \in R^{\Sigma_{i=1}^{n} d_1 \times d_1}$, $C_{i,1} \in R^{\Sigma_{i=1}^{n} d_2 \times d_1}$, $C_{1,j} \in R^{\Sigma_{i=1}^{n} d_1 \times d_2}$, and $C_{i,j} \in R^{\Sigma_{i=1}^{n} d_2 \times d_2}$ (i, j=2, . . . , $S_t$). By implementing a Woodbury formula, the accelerated update can be expressed as follows:

$$(X_t'X_t + \lambda_1 M_t + \lambda_2 I_t)^{-1} = C - C M_{t1} D^{-1} M_{t1}' C \quad (7)$$

where D can be written as follows:

$$D = \begin{vmatrix} M C_{1,1} M' & M \sum_{j=2}^{S_t+1} C_{1,j} \\ \sum_{i=1}^{S_t+1} C_{i,1} M' & \sum_{i=2}^{S_t+1} \sum_{j=2}^{S_t+1} C_{i,j} \end{vmatrix}$$

By calculating an accelerated update for the optimization of the generated model, instead of computing the inverse of a $(d_1 + S_t d_2) \times (d_1 + S_t d_2)$ matrix, only the inverse of a $(2d_2) \times (2d_2)$ matrix must be computed, which is independent of the number of tasks within each group.

In one embodiment, the optimization detailed above may be implemented as a Heterogeneous tAsk Relatedness (HEAR) algorithm. The HEAR algorithm receives inputs of $A_{t,s}, B_{t,s}, y_{t,s}$ (t=1, . . . , T, s=1, . . . , $S_t$), $\lambda_1, \lambda_2$, and a maximum number of iterations in order to output $\alpha_t, \beta_{t,s}$ (t=1, . . . , T, s=1, . . . , M, and $\alpha_0$. The HEAR algorithm initializes the coefficient vectors to be vectors of all 1s, computes matrix C as expressed above to update the coefficient vectors via equation (7), and repeatedly updates M via equation (3), $\alpha_0$ via equation (4), and all the coefficient vectors via equations (5) and (7) the maximum number of iterations. Based on the coefficient vectors obtained by the HEAR algorithm, given an unlabeled example from the $s^{th}$ task of the $t^{th}$ group with independent variables $a_{t,s} \in R^{\Sigma_{i=1}^{n} d_1}$ and dependent variables $b_{t,s} \in R^{\Sigma_{i=1}^{n} d_2}$, output of the unlabeled example can be predicted by using $a_{t,s}'\alpha_t + b_{t,s}'\beta_{t,s}$.

Figure 4:
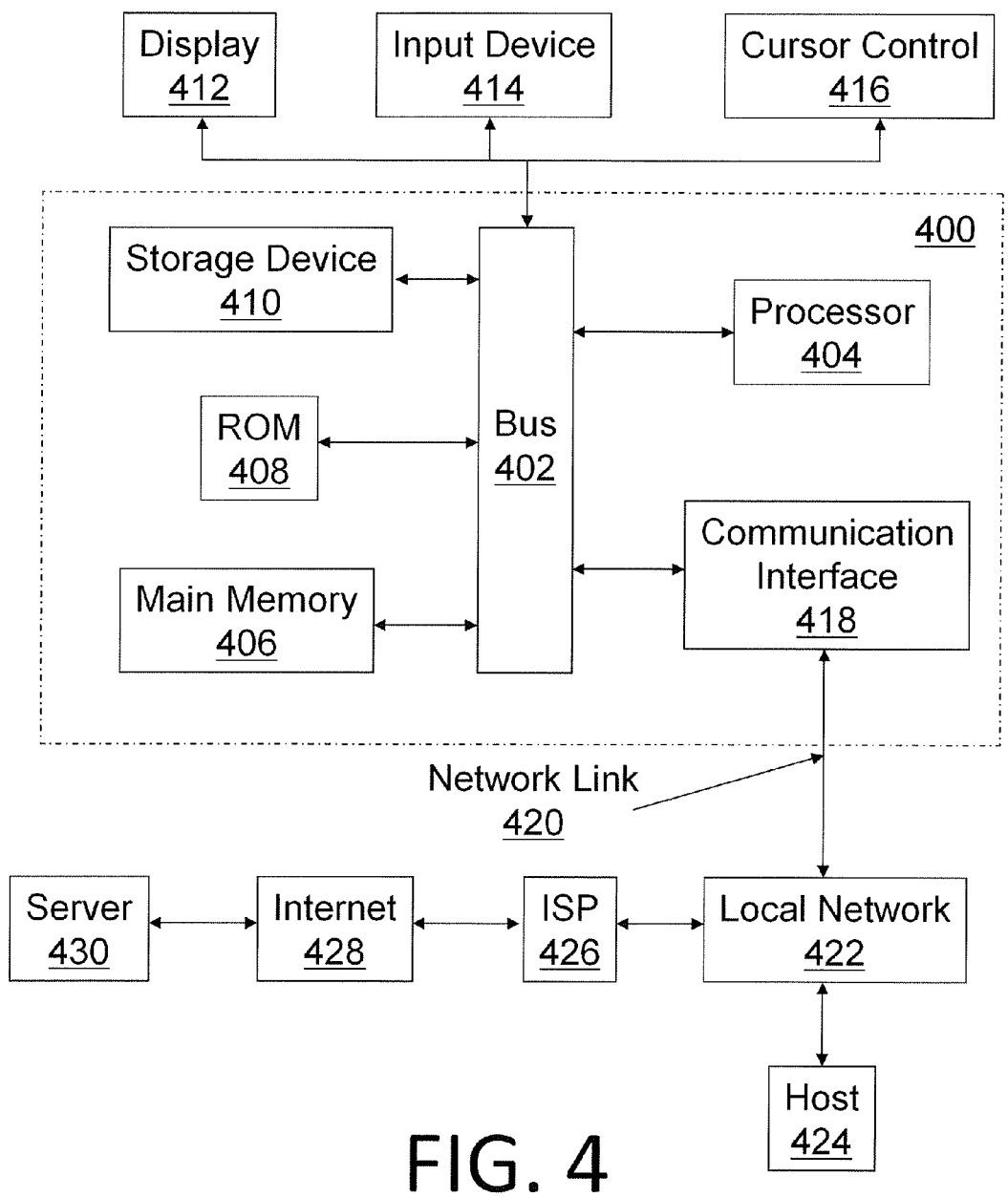
FIG. 4 is a block diagram illustrating a conventional computer system 400 within which a set of instructions, for causing the machine to perform any one or more of the methodologies and operations discussed herein, may be executed.

FIG. 4 is a block diagram illustrating a conventional computer system 400 within which a set of instructions, for causing the machine to perform any one or more of the methodologies and operations discussed herein, may be executed. Computer system 400 includes a bus 402 or other communication mechanism for communicating information, and a processor or processors 404 coupled with bus 402 for processing information. Computer system 400 also includes a main memory 406, such as a random access memory (RAM) or other dynamic storage device, coupled to bus 402 for storing information and instructions to be executed by processor 404. Main memory 406 also may be used for storing temporary variables or other intermediate information during execution of instructions to be executed by processor 404. Computer system 400 further includes a read only memory (ROM) 408 or other static storage device coupled to bus 402 for storing static information and instructions for processor 404. A storage device 410, such as a magnetic disk or optical disk, is provided and coupled to bus 402 for storing information and instructions.

Computer system 400 may be coupled via bus 402 to a display 412, such as a cathode ray tube (CRT), for displaying information to a computer user. An input device 414, including alphanumeric and other keys, is coupled to bus 402 for communicating information and command selections to processor 404. Another type of user input device is cursor control 416, such as a mouse, a trackball, or cursor direction keys for communicating direction information and command selections to processor 404 and for controlling cursor movement on display 412. This input device typically has two degrees of freedom in two axes, a first axis (e.g., x) and a second axis (e.g., y), that allows the device to specify positions in a plane.

Computer system 400 may be used to process all wafer data and converts the wafer data, using equations and principles discussed herein, into usable data. The pertinent programs and executable code is contained in main memory 406 and is selectively accessed and executed in response to processor 404, which executes one or more sequences of one or more instructions contained in main memory 406. Such instructions may be read into main memory 406 from another computer-readable medium, such as storage device 410. One or more processors in a multi-processing arrangement may also be employed to execute the sequences of instructions contained in main memory 406. In alternative embodiments, hard-wired circuitry may be used in place of or in combination with software instructions and it is to be understood that no specific combination of hardware circuitry and software are required.

The instructions may be provided in any number of forms such as source code, assembly code, object code, machine language, compressed or encrypted versions of the foregoing, and any and all equivalents thereof. "Computer-readable medium" refers to any medium that participates in providing instructions to processor 404 for execution and "program product" refers to such a computer-readable medium bearing a computer-executable program. The computer usable medium may be referred to as "bearing" the instructions, which encompass all ways in which instructions are associated with a computer usable medium.

Computer-readable mediums include, but are not limited to, non-volatile media, volatile media, and transmission media. Non-volatile media include, for example, optical or magnetic disks, such as storage device 410. Volatile media include dynamic memory, such as main memory 406. Transmission media include coaxial cables, copper wire and fiber optics, including the wires that comprise bus 402. Transmission media may comprise acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 404 for execution. For example, the instructions may initially be borne on a magnetic disk of a remote computer. The remote computer can load the instructions into its dynamic memory and send the instructions over a telephone line using a modem. A modem local to computer system 400 can receive the data on the telephone line and use an infrared transmitter to convert the data to an infrared signal. An infrared detector coupled to bus 402 can receive the data carried in the infrared signal and place the data on bus 402. Bus 402 carries the data to main memory 406, from which processor 404 retrieves and executes the instructions. The instructions received by main memory 406 may optionally be stored on storage device 410 either before or after execution by processor 404.

Computer system 400 may also include a communication interface 418 coupled to bus 402 to provide a two-way data communication coupling to a network link 420 connected to a local network 422. For example, communication interface 418 may be an integrated services digital network (ISDN) card or a modem to provide a data communication connection to a corresponding type of telephone line. As another example, communication interface 418 may be a local area network (LAN) card to provide a data communication connection to a compatible LAN. Wireless links may also be implemented. In any such implementation, communication interface 418 sends and receives electrical, electromagnetic or optical signals that carry digital data streams representing various types of information.

Network link 420 typically provides data communication through one or more networks to other data devices. For example, network link 420 may provide a connection through local network 422 to a host computer 424 or to data equipment operated by an Internet Service Provider (ISP) 426. ISP 426 in turn provides data communication services through the worldwide packet data communication network, now commonly referred to as the "Internet" 428. Local network 422 and Internet 428 both use electrical, electromagnetic or optical signals that carry digital data streams. The signals through the various networks and the signals on network link 420 and through communication interface 418, which carry the digital data to and from computer system 400, are exemplary forms of carrier waves transporting the information. Thus, the processing required by methods of the invention described by way of example herein may be implemented on a local computer utilizing storage device 410 or may be implemented, for example, on a LAN or over the internet.

Computer system 400 can send messages and receive data, including program code, through the network(s), network link 420, and communication interface 418. In the Internet example, a server 430 might transmit a requested code for an application program through Internet 428, ISP 426, local network 422 and communication interface 418. The received code may be executed by processor 404 as it is received, and/or stored in storage device 410, or other non-volatile storage for later execution. In this manner, computer system 400 may obtain application code in the form of a carrier wave.

Figure 5A:
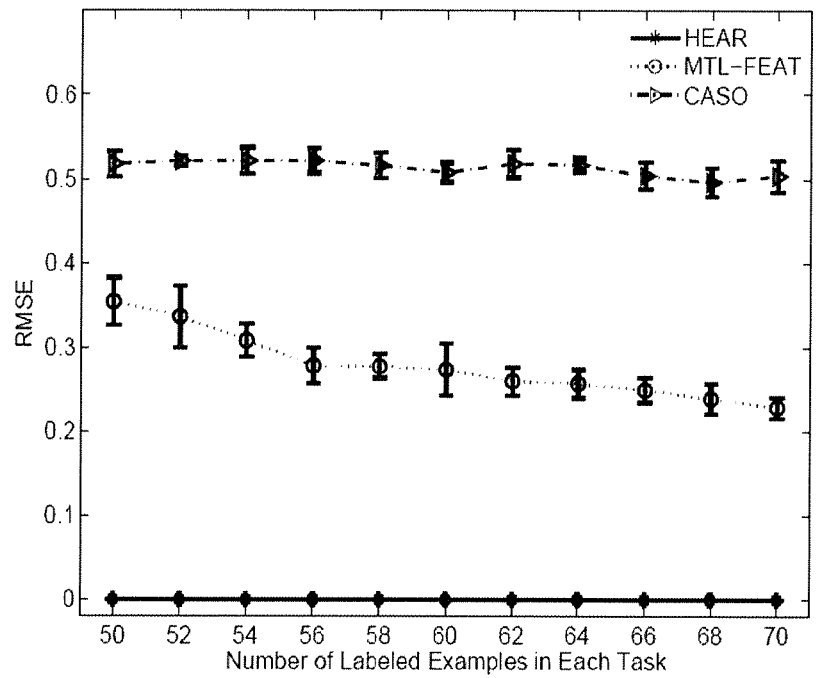
FIG. 5(a) illustrates the experimental results of the prediction performance of the HiErarchical tAsk Relatedness (HEAR) algorithm as compared to the prior art MTL-FEAT and CASO algorithms on a synthetic data set with no noise.
Figure 5B:
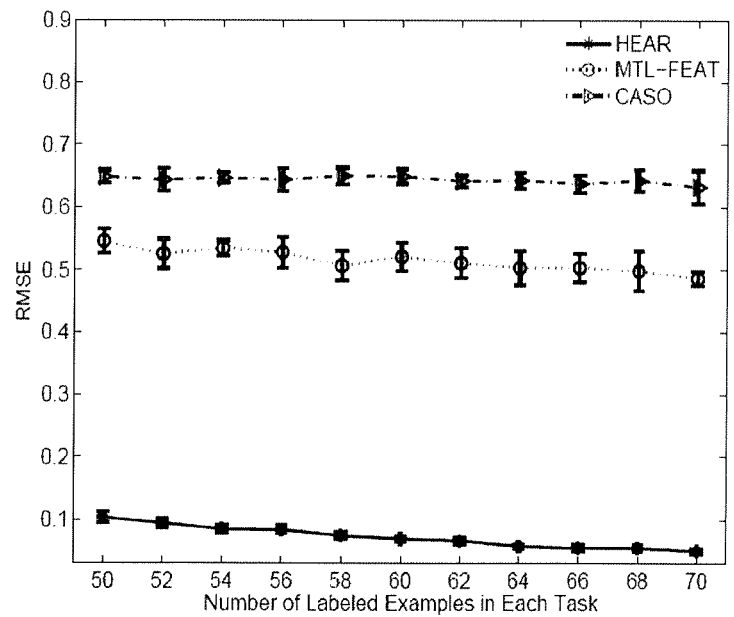
FIG. 5(b) illustrates the experimental results of the prediction performance of the HEAR algorithm as compared to the prior art MTL-FEAT and CASO algorithms on a synthetic data set with Gaussian noise with standard deviation 0.2.

FIGS. 5(*a*), 5(*b*), and 6 illustrate experimental results of the prediction performance of the HEAR algorithm as compared to the prior art MTL-FEAT algorithm, as taught by the 2008 Machine Learning article entitled "Convex multi-task feature learning," which is herein fully incorporated by reference, and the prior art CASO algorithm, as disclosed by the 2009 ICML article entitled "A convex formulation for learning shared structures from multiple tasks," which is herein fully incorporated by reference, on both synthetic and real data sets for semiconductor manufacturing. Referring to FIGS. 5(*a*) and 5(*b*), the algorithms are compared to each other on a synthetic data set. The synthetic data set consists of 3 groups, each with 3 tasks. For each task, 100 examples are randomly generated, which are described by 100 independent variables and 50 dependent variables. For each group of tasks, a single coefficient vector $\alpha_t$ for the set of independent variables is utilized. And, for the tasks within the same group, their coefficient vectors $\beta_{t,s}$ for the set of dependent variables are obtained by perturbing the product of a random matrix M (50×100) with $\alpha_t$. Finally, the output $y_{t,s}$ is obtained by multiplying the two sets of variables with the corresponding coefficient vectors, plus Gaussian noise with various standard deviations.

The comparison results are shown in FIGS. 5(*a*) and 5(*b*), where the x-axis is the number of training examples, and the y-axis is the Root of Mean Squared Error (RMSE) averaged over all the tasks and 10 runs. FIG. 5(*a*) shows the RMSE with no noise and FIG. 5(*b*) shows the RMSE for Gaussian noise with standard deviation 0.2. From FIGS. 5(*a*) and 5(*b*), it is apparent that the HEAR algorithm performs much better than MTL-FEAT and CASO algorithms for multi-task learning with heterogeneous task relatedness. To be specific, when there is no noise in the data, the HEAR algorithm can perfectly recover the underlying model in terms of the coefficient vectors, and when there is a small amount of noise, the HEAR algorithm outperforms the other two algorithms in terms of both the average RMSE and its standard deviation.

Figure 6:
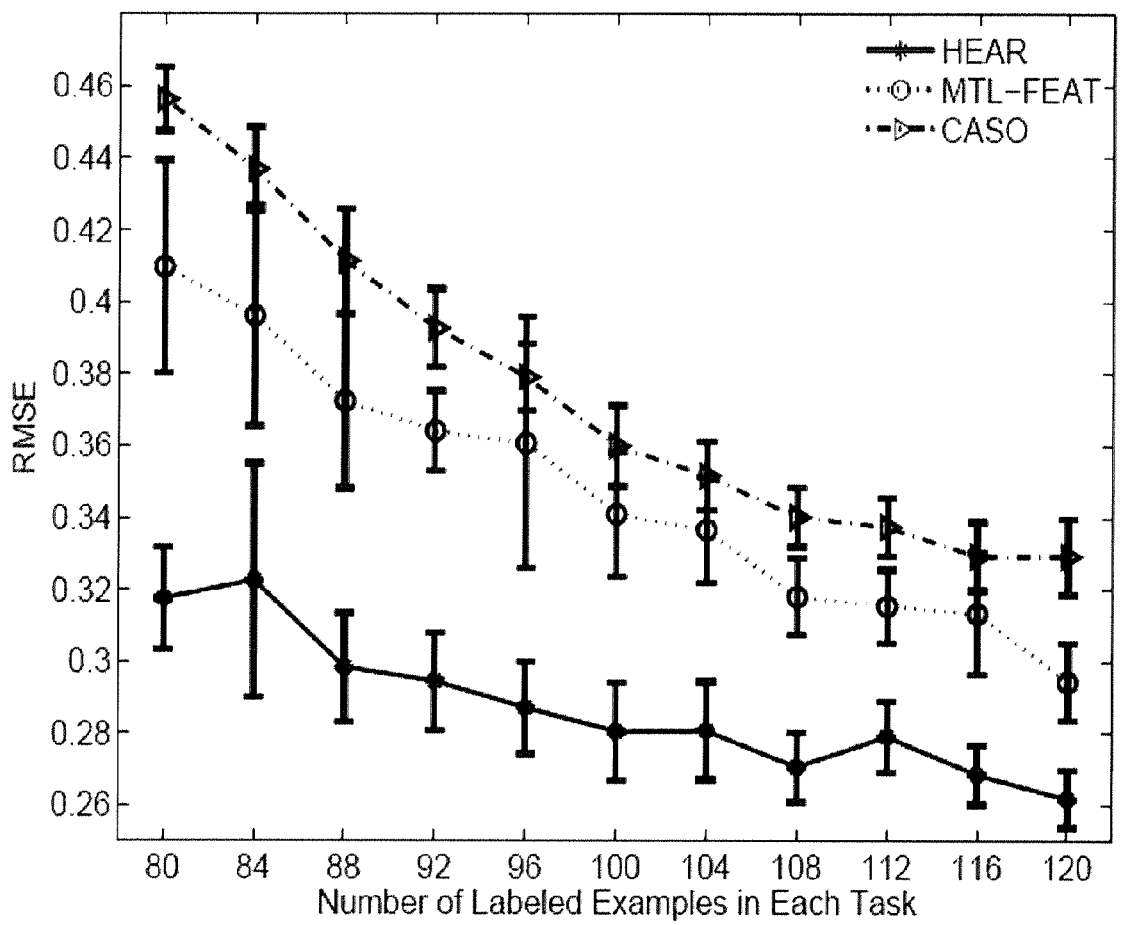
FIG. 6 illustrates the experimental results of the prediction performance of the HEAR algorithm as compared to the prior art MTL-FEAT and CASO algorithms on a data set collected from a semiconductor manufacturing process.

FIG. 6 shows the experimental comparison results of the algorithms on a data set collected from a semiconductor manufacturing process. For semiconductors, the manufacturing process deposits dielectric materials as capping film on wafers, whose quality is mainly determined by, but not limited to, the deposition thickness. Wafer data from 4 chambers and 2 sides per chamber was collected and each produced wafer is described by 56 independent variables and 31 dependent variables. The drift and variation of both types of variables can cause wafer quality variation. For purposes of the experiments, the set of independent variables included pressure, power, temperature, gas flows, etc., which may be subject to the advanced process controller 150. These variables determine the environment of the chamber and are shared by the 2 sides of each chamber. On the other hand for the experimental comparison, the set of dependent variables included impedance, electric bias, throttle valve positions, etc., which have impacts on the quality of the wafers that are largely affected by the set of independent variables.

For purposes of the experiments, the data set consists of the measurements of 1651 wafers together with their deposition thickness in a 5 month period. After removing some outliers, there are around 200 examples from each of the 8 chamber sides. As a pre-processing step, the process variables and the outputs are normalized to have mean 0 and standard deviation 1.

The test errors averaged over all the sides/tasks for all three algorithms are shown in FIG. 6, where the x-axis is the number of labeled examples in each task, and the y-axis is the RMSE average over all the tasks and 10 runs. As illustrated in FIG. 6, the performance of the HEAR algorithm is consistently better than the others under each training set size, especially when the number of labeled examples is small. This is due to the fact that the HEAR algorithm leverages the grouping of the tasks and imposes heterogeneous task relatedness accordingly, which better models the relationship between input process variables and output wafer quality measurements.

Various embodiments disclosed herein are described as including a particular feature, structure, or characteristic, but every aspect or embodiment may not necessarily include the particular feature, structure, or characteristic. Further, when a particular feature, structure, or characteristic is described in connection with an embodiment, it will be understood that such feature, structure, or characteristic may be included in connection with other embodiments, whether or not explicitly described. Thus, various changes and modifications may be made to the provided description without departing from the scope or spirit of the disclosure.

Other embodiments, uses and features of the present disclosure will be apparent to those skilled in the art from consideration of the specification and practice of the inventive concepts disclosed herein. The specification and drawings should be considered exemplary only, and the scope of the disclosure is accordingly intended to be limited only by the following claims.

What is claimed is:

1. A method for predicting quality of wafers produced by production equipment that includes multiple chambers in each of which multiple wafers are simultaneously processed, comprising:
    measuring process variables of each of the wafers;
    sending the process variables to a central database;
    receiving the process variables of each of the wafers and historical measurements;
    representing respective sides of the multiple chambers as wafer quality predictive modeling tasks based on the historical measurements;
    grouping the wafer quality predictive modeling tasks according to heterogeneous relatedness of the production equipment, said grouping step including, for each chamber in which multiple wafers are simultaneously processed, grouping wafer quality predictive modeling tasks for all of the respective sides of the each chamber, each chamber of the multiple chambers being treated as a group of one or more wafers quality predictive modeling tasks;
    partitioning the process variables into two sets;
    generating a prediction model that accommodates the grouping of the wafer quality predictive modeling tasks from the grouping step and the partitioned process variables from the partitioning step;
    predicting a quality of each of the wafers produced in individuals sides of the multiple chambers based on the prediction model generated in the generating step;
    sending the predicted quality of each of the wafers to an advanced process controller and the central database;
    measuring an actual quality of at least one sample of the wafers;
    sending the actual quality of at least one sample of the wafers to the advanced process controller and a virtual metrology machine;
    updating the virtual metrology machine with the actual quality of at least one sample of the wafers;
    determining a feedback control by the advanced process controller; and
    processing the wafers by the production equipment in accordance with the feedback control,
    wherein the receiving, representing, grouping, partitioning, generating, and predicting steps are executed by a virtual metrology machine implemented on a computer, and
    wherein for each chamber in which multiple wafers are simultaneously processed, each side of the each chamber processes only one wafer at a time.

2. The method of claim 1, wherein a first set of the two sets of the process variables represents independent variables and a second set of the two sets of the process variables represents dependent variables.

3. The method of claim 2, wherein the prediction model is generated as a function of coefficient vectors for the independent variables and the dependent variables.

4. The method of claim 3, wherein the prediction model accommodates the grouping of the wafers by connecting the coefficient vectors for the independent variables and the dependent variables through a transformation matrix and imposing similarity on the coefficient vectors for one or more of the independent variables and the dependent variables.

5. The method of claim 1 further comprising:
    optimizing the prediction model by implementing a block coordinate descent.

6. The method of claim 5, wherein the block coordinate descent includes an accelerated update.

7. The method of claim 1, wherein the process variables are indicative of production of each of the wafers processed by the production equipment.

8. The method of claim 1, wherein the historical measurements are examples of actual wafer quality measurements.

9. The method of claim 2, wherein the independent variables are selected from the group consisting of pressure, power, temperature, and gas flows, each member of the group being subject to an advanced process controller.

10. The method of claim 2, wherein the dependent variables are selected from the group consisting of impedance, electric bias, and throttle valve positions, and have an impact on the quality of the wafers being heavily dependent on the independent variables.

11. The method of claim 1, wherein the feedback control is determined based on the predicted quality.

12. The method of claim 1, wherein the feedback control is determined based on the predicted quality and the actual quality.

13. The method of claim 1, wherein the quality of the wafers is measured in terms selected from the group consisting of deposition thickness, resistance, stress, and refractive index.

* * * * *